US009373942B2

(12) United States Patent
Feldmeier et al.

(10) Patent No.: US 9,373,942 B2
(45) Date of Patent: Jun. 21, 2016

(54) SYSTEM FOR THE CONTACTLESS DATA SUPPLY OF BUS PARTICIPANT MODULES

(71) Applicant: Tyco Electronics AMP GmbH, Bensheim (DE)

(72) Inventors: Guenter Feldmeier, Lorsch (DE); Bert Bergner, Bensheim (DE)

(73) Assignee: TE CONNECTIVITY GERMANY GMBH, Bensheim (DE)

( * ) Notice: Subject to any disclaimer, the term of this patent is extended or adjusted under 35 U.S.C. 154(b) by 0 days.

(21) Appl. No.: 14/394,088

(22) PCT Filed: Apr. 2, 2013

(86) PCT No.: PCT/EP2013/056946
§ 371 (c)(1),
(2) Date: Oct. 11, 2014

(87) PCT Pub. No.: WO2013/152972
PCT Pub. Date: Oct. 17, 2013

(65) Prior Publication Data
US 2015/0077907 A1    Mar. 19, 2015

(30) Foreign Application Priority Data

Apr. 12, 2012  (DE) .......................... 10 2012 205 979

(51) Int. Cl.
H04B 1/3877    (2015.01)
H02B 1/20      (2006.01)
H05K 7/14      (2006.01)
G06F 13/40     (2006.01)
H02B 1/21      (2006.01)

(52) U.S. Cl.
CPC ............ *H02B 1/205* (2013.01); *G06F 13/4068* (2013.01); *H02B 1/21* (2013.01); *H05K 7/14* (2013.01); *H05K 7/1465* (2013.01); *H05K 7/1474* (2013.01)

(58) Field of Classification Search
CPC ............ H02B 1/205; H02B 1/21; H05K 7/14; H05K 7/1474; H05K 7/1465; G06F 13/4068; H04B 5/02; H04B 1/38; H04B 1/3877; H04B 10/40
See application file for complete search history.

(56) References Cited

U.S. PATENT DOCUMENTS 5,924,044 A * 7/1999 Vannatta ............. H04M 1/0214
                                                  379/433.05

(Continued)

FOREIGN PATENT DOCUMENTS

WO    WO 2008/092547 A1    8/2008

OTHER PUBLICATIONS

International Search Report and Written Opinion issued by the European Patent Office dated Sep. 25, 2013, for International Application No. PCT/EP2013/056946; 10 pages.

*Primary Examiner* — Andrew Wendell
(74) *Attorney, Agent, or Firm* — Faegre Baker Daniels LLP

(57) ABSTRACT

The present invention relates to a modular data transmission system which is constructed for contactless data transmission by means of electromagnetic waves having a wavelength in the millimeter range. A modular data transmission system according to the invention comprises a mounting rail, a first bus participant and a second bus participant. The first bus participant comprises a transmitting/receiving module. The second bus participant also comprises a transmitting/receiving module. The first bus participant and the second bus participant are releasably secured to the mounting rail so as to be able to be attached to each other, and the transmitting/receiving modules of the first and second bus participants are constructed in order to transmit data by means of electromagnetic waves having a wavelength in the millimeter range. Another modular data transmission system according to the invention comprises a mounting rail and at least a first bus participant. The mounting rail comprises at least one transmitting/receiving module. The first bus participant comprises a transmitting/receiving module and is releasably secured to the mounting rail. The mounting rail allows additional bus participants to be secured in an attachable manner to the first bus participant. Furthermore, the transmitting/receiving modules of the mounting rail and the first bus participant are constructed for data transmission by means of electromagnetic waves having a wavelength in the millimeter range.

22 Claims, 12 Drawing Sheets

(56) References Cited

U.S. PATENT DOCUMENTS

2004/0077347 A1* 4/2004 Lauber ................ G08G 1/0962
                                                          455/428
2004/0266382 A1   12/2004 Lindstedt
2009/0157937 A1* 6/2009 Kuschke .............. H01R 9/2675
                                                          710/305
2012/0091818 A1* 4/2012 Wesemann ............. H02J 5/005
                                                          307/104

* cited by examiner

SYSTEM FOR THE CONTACTLESS DATA SUPPLY OF BUS PARTICIPANT MODULES

The invention relates to a system for the contactless data supply of bus participant modules in an industrial environment.

Currently known bus participant modules are peripheral modules for industrial uses, for example, input/output modules of automation technology. Such peripheral modules generally have to comply with particular requirements both in electrical terms and with regard to their ambient conditions.

Thus, for example, compliance with particular protection criteria is necessary for the use of bus participant modules in particularly harsh industrial environments. Generally known classifications of protective types such as, for example, IEC 60529, determine the suitability of an electrical operating means for operation in an admissible temperature range and with corrosive loading such as, for example, the resistance to aggressive substances in industry such as moisture, water, vapour, acids, alkaline solutions, oil or fuels.

For the purpose of being able to be used in a versatile manner in industry, a high protection class of the bus participant module is desirable. Accordingly, special protection steps are often taken from a mechanical perspective against ambient influences such as dust and moisture, up to protection from flying sparks for environments at risk of explosion.

However, the protection class is low in the case of known bus participant modules because exposed electrical contacts are generally provided for data transmission between the individual bus participant modules.

For example, U.S. Pat. No. 6,371,435 B1 discloses a system comprising a plurality of bus participant modules. In this system, there are used bus participant modules which each contain data bus lines and also electrical current supply lines for an integrated electronic unit. Each bus participant module has externally at the lateral faces exposed pressure contacts relative to the neighbouring modules in such a manner that the contacts contact each other automatically in the arrangement direction of the bus participant modules when the bus participant module is engaged on the mounting rail. Bus participant modules engaged on the mounting rail are consequently connected to continuous data bus and current supply lines to form a terminal bus.

Although this system brings about a simple and modular connection in order to supply data to bus participant modules, the electrical contacting can result in a high corrosive loading of the exposed electrical contacts in particularly harsh industrial environments, which results in disadvantages in terms of the signal integrity for the data supply of the bus participant modules.

Therefore, an object of the invention is to provide a technical connection means for a system comprising bus participants which allows a robust data transmission between the bus participant modules and is also suitable for use in particularly harsh industrial environments.

This object is achieved according to the invention in that the bus participant modules which can be attached to each other on a mounting rail comprise at least one transmitting/receiving module which is constructed by means of electromagnetic waves having a wavelength in the millimetre range for contactless data transmission.

The wavelength is advantageous between 1 and 5 millimetres so that the transmitting/receiving modules are suitable for transmitting/receiving electromagnetic waves having a carrier frequency between 61 GHz and 244 GHz.

In particular, data transmission by means of electromagnetic waves having a wavelength in the millimetre range allows a reduction in the electromagnetic distortions at relatively large distances because electromagnetic waves having such a wavelength are subjected to a high level of damping in the air. Furthermore, data transmission by means of electromagnetic waves having a wavelength in the millimetre range requires a low level of transmission power.

A modular data transmission system according to the invention comprises a mounting rail, a first bus participant and a second bus participant. The first bus participant comprises a transmitting/receiving module. The second bus participant also comprises a transmitting/receiving module. The first bus participant and the second bus participant are releasably secured to the mounting rail so as to be able to be attached to each other, and the transmitting/receiving modules of the first and second bus participants are constructed in order to transmit data by means of electromagnetic waves having a wavelength in the millimetre range.

In an advantageous embodiment of the modular data transmission system according to the invention, at least the first and/or the second bus participant comprise(s) a waveguide which is constructed for the low-loss transmission of the electromagnetic waves and which is arranged between the transmitting/receiving module of the first bus participant and the transmitting/receiving module of the second bus participant.

In another advantageous embodiment, the modular data transmission system according to the invention comprises a third bus participant which comprises a transmitting/receiving module and which is releasably secured to the mounting rail so as to be attached to the first bus participant. The first bus participant further comprises a second transmitting/receiving module, the second transmitting/receiving module and the transmitting/receiving module of the third bus participant being constructed for data transmission by means of electromagnetic waves having a wavelength in the millimetre range. At least the first and/or the third bus participant(s) optionally comprise(s) a waveguide which is constructed for the low-loss transmission of the electromagnetic waves and which is arranged between the transmitting/receiving module of the first bus participant and the transmitting/receiving module of the third bus participant.

In another advantageous embodiment of the modular data transmission system according to the invention, the bus participants each comprise a control unit which is connected to one or both of the transmitting/receiving modules of the corresponding bus participant. In the event of a plurality of transmitting/receiving modules per bus participant, which modules are connected to the control unit, the control unit forwards data received by one transmitting/receiving module to the other transmitting/receiving module for data transmission.

The wavelength is advantageously between 1 and 5 millimetres in the modular data transmission system according to the invention so that the transmitting/receiving modules are suitable for transmitting/receiving electromagnetic waves having a carrier frequency between 61 GHz and 244 GHz.

Another modular data transmission system according to the invention comprises a mounting rail and at least a first bus participant. The mounting rail comprises at least one transmitting/receiving module. The first bus participant comprises a transmitting/receiving module and is releasably secured to the mounting rail. The mounting rail allows additional bus participants to be secured in an attachable manner to the first bus participant. The transmitting/receiving modules of the mounting rail and the first bus participant are further constructed for data transmission by means of electromagnetic waves having a wavelength in the millimetre range.

In an advantageous embodiment of the modular data transmission system according to the invention, the first bus participant comprises a waveguide which is constructed for the low-loss transmission of the electromagnetic waves and which is arranged between the transmitting/receiving module of the first bus participant and the transmitting/receiving module of the mounting rail.

In another advantageous embodiment, the modular data transmission system according to the invention comprises a second bus participant. The second bus participant comprises a transmitting/receiving module and the mounting rail comprises a second transmitting/receiving module. The second bus participant is releasably secured to the mounting rail so as to be attached to the first bus participant. The additional transmitting/receiving modules of the mounting rail and the second bus participant are constructed for data transmission by means of electromagnetic waves having a wavelength in the millimetre range. At least the first and/or the second bus participant optionally comprise(s) a waveguide which is constructed for the low-loss transmission of the electromagnetic waves and which is arranged between the transmitting/receiving module of the second bus participant and the transmitting/receiving module of the mounting rail.

In another advantageous embodiment of the modular data transmission system according to the invention, the bus participants each comprise a control unit which is connected to the plurality of transmitting/receiving modules of the mounting rail and which forwards data received by one transmitting/receiving module to at least one of the other transmitting/receiving modules for data transmission.

Advantageously, the wavelength in the modular data transmission system according to the invention is between 1 and 5 millimetres so that the transmitting/receiving modules are suitable for transmitting/receiving electromagnetic waves having a carrier frequency between 61 GHz and 244 GHz.

According to another advantageous embodiment of a preceding modular data transmission system according to the invention, at least one of the bus participants comprise(s) an electrical connection device. The bus participant is further arranged in a receiving member of the mounting rail and releasably connected to the mounting rail thereby. The receiving member of the mounting rail comprises an electrical counter-connection device which, in the connected state, is connected to the electrical connection device of the first bus participant for transmission of supply energy.

Advantageously, the electrical connection device of the bus participant in the modular data transmission system according to the invention forms, with the electrical counter-connection device of the receiving member, a contactless or contact-forming plug type connection for transmitting supply energy.

In another advantageous embodiment of the modular data transmission system according to the invention, the electrical connection device of the bus participant further comprises a part-transmitter having a transmitting/receiving coil and the electrical counter-connection device of the receiving member also comprises a part-transmitter having a transmitting/receiving coil, the part-transmitter of the bus participant optionally being integrated in the transmitting/receiving module of the bus participant.

According to another advantageous embodiment of one of the preceding modular data transmission systems according to the invention, at least one waveguide is arranged in the bus participant in such a manner that the first end of the waveguide is opposite the corresponding transmitting/receiving module of the bus participant and the other end of the waveguide extends to the outer side of the bus participant and this end is opposite a transmitting/receiving module of the adjacent bus participant or a transmitting/receiving module of the mounting rail.

According to another advantageous embodiment of one of the preceding modular data transmission systems according to the invention, the second end of the corresponding waveguide which extends to the outer side of the bus participant is constructed in a funnel-like manner in order to compensate for positioning tolerances when the bus participants are secured to the mounting rail, and optionally the first end of the waveguide is also constructed in a funnel-like manner.

At least one waveguide in the modular data transmission system according to the invention is advantageously constructed as a hollow conductor having a circular or angular cross-section.

Alternatively, at least one waveguide in the modular data transmission system according to the invention is constructed as a structure having a dielectric material as a core and having one or more metal delimiting elements which surround the core so that the delimiting element(s) form(s) a wave propagation path having a circular or angular cross-section.

Alternatively, at least one waveguide in the modular data transmission system according to the invention is constructed as a structure having a first dielectric material as a core and having a second dielectric material which surrounds the core, the second dielectric material having a circular or angular cross-section and the boundary face between the first and second dielectric material reflecting the electromagnetic waves.

According to another advantageous embodiment of one of the preceding modular data transmission systems according to the invention, the transmitting/receiving module(s) is/are constructed as a separately arranged transmitting and receiving device in the bus participant and a waveguide is provided for each transmitting and receiving device.

For a better understanding of the present invention, it is explained in greater detail with reference to the embodiments illustrated in the following Figures. Identical components are referred to using the same reference numerals and the same component designations. Furthermore, individual features or feature combinations from the embodiments shown and described may also individually constitute independent inventive solutions or solutions according to the invention. In the drawings:

FIGS. 1+2 are schematic illustrations of the data transmission of the system according to the invention for the contactless data supply of bus participant modules according to a first and a second embodiment;

FIGS. 3a+3b are perspective illustrations of the system according to the invention for the contactless data supply of bus participant modules with and without a housing of the individual bus participant modules of the first or second embodiment;

FIGS. 4a+4b are a front and a rear detailed view of the perspective illustration from FIG. 3b;

Figure 12A:
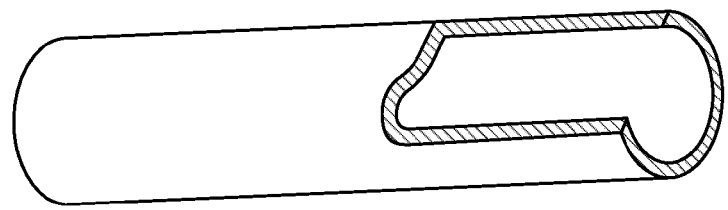

FIGS. 12a–2c are perspective illustrations of different waveguides for use in the system according to the invention for the contactless data supply of bus participant modules according to one of the preceding embodiments; and FIGS. 13a–13g are perspective illustrations of different waveguides for use in the system according to the invention for the contactless data supply of bus participant modules according to one of the preceding embodiments.

Figure 1:
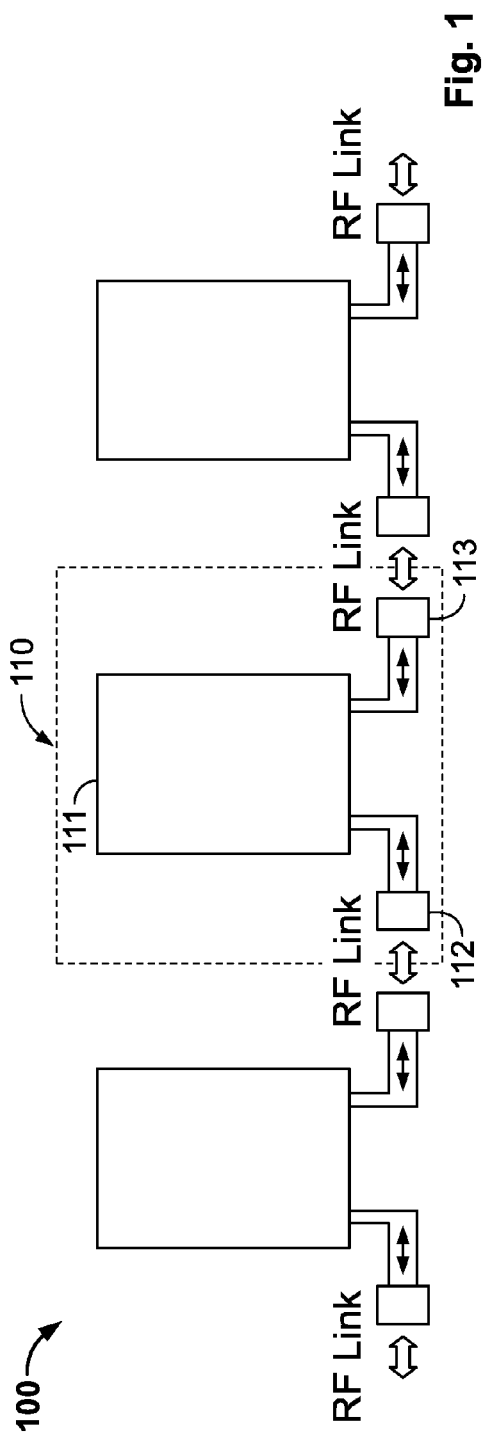
Figure 2:
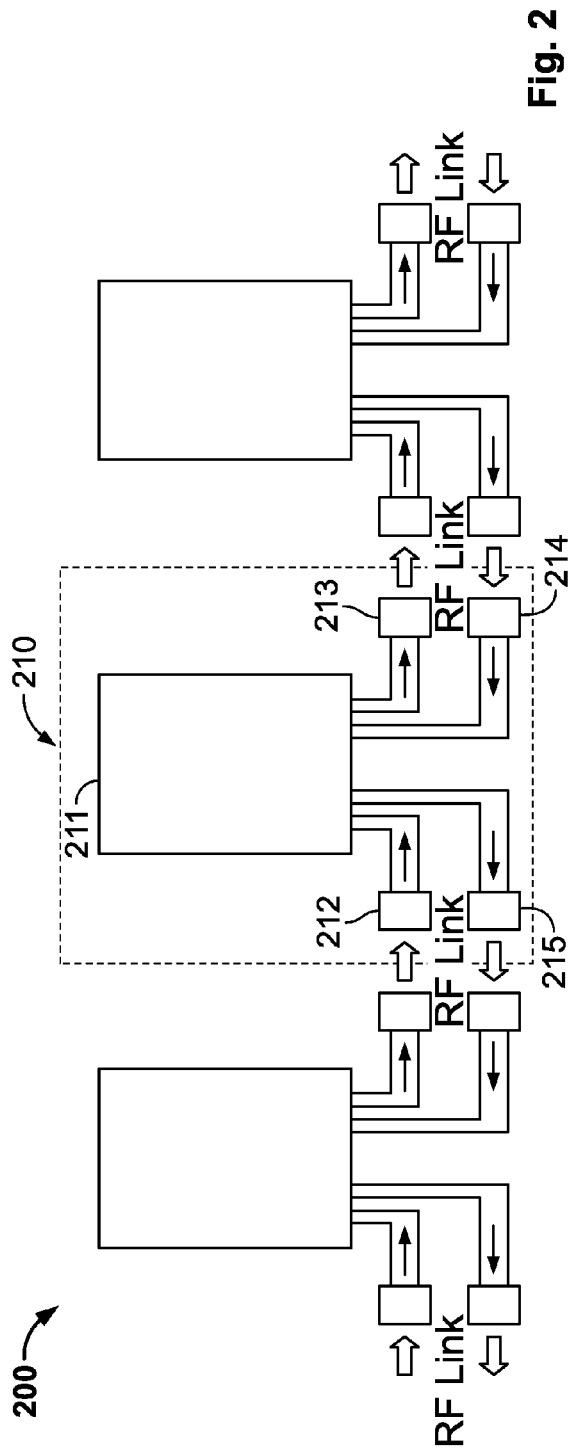

With reference to FIGS. 1 and 2, the general inventive principle of the system for the contactless data supply of bus participant modules is initially intended to be explained in greater detail below.

FIGS. 1 and 2 illustrate a modular data transmission system of a first and second embodiment according to the invention. Both embodiments of the modular data transmission system allow the contactless data supply of bus participant modules.

The modular data transmission system 100 comprises a plurality of bus participant modules, for example, bus participant modules 110 and 120, which are constructed for contactless data transmission. All the bus participant modules which are connected in the system 100 are preferably of the same type and, in this instance, the following description may be applied equally to such bus participant modules.

The modular data transmission system 200 comprises a plurality of bus participant modules, for example, bus participant modules 210 and 220, which are constructed for contactless data transmission. All the bus participant modules which are connected in the system 200 are preferably of the same type and, in this instance, the following description may be applied equally to such bus participant modules.

For contactless data transmission, each of the first and second bus participant modules 110 or 210 illustrated comprises at least one transmitting/receiving module 112, 113 or 212, 213, 214, 215 which allows contactless data transmission to an adjacently arranged bus participant module of the system. To that end, the at least one transmitting/receiving module of the first bus participant module and the at least one transmitting/receiving module of the second bus participant module are preferably arranged opposite each other.

The bus participant module 110 of the first embodiment comprises a first transmitting/receiving module 112 and a second transmitting/receiving module 113. Both transmitting/receiving modules 112, 113 of the bus participant module 110 are preferably constructed for two-way data transmission. Simultaneous two-way data transmission is possible with two adjacent bus participant modules by means of the two transmitting/receiving modules 112, 113.

The bus participant module 210 of the second embodiment comprises a first transmitting/receiving module group 212, 215 and a second transmitting/receiving module group 213, 214. The first transmitting/receiving module group 212, 215 comprises a first receiving module 212 and a first transmitting module 215. The second transmitting/receiving module group 213, 214 comprises a first transmitting module 213 and a second receiving module 214.

The four transmitting/receiving modules 212, 213, 214 and 215 of the corresponding bus participant module 210 are preferably constructed for one-way data transmission. Simultaneous two-way data transmission is possible with two adjacent bus participant modules by means of the four transmitting/receiving modules 212, 213, 214 and 215.

Consequently, the modular data transmission system 100 of the first embodiment differs from the modular data transmission system 200 of the second embodiment in that the bus participant module 120 of the first system 100 has integrated transmitting/receiving modules 112 and 113 which each comprise a transmitter and a receiver, and the bus participant module 210 of the second system 200 has groups comprising a dedicated transmitting module and a dedicated receiving module 212, 213, 214 and 215.

A common aspect of the above-described transmitting/receiving modules 112, 113 or 212, 213, 214 and 215 of the corresponding bus participant modules 110, 210 is that they are constructed for data transmission by means of electromagnetic waves having a wavelength in the millimetre range.

In connection with this invention, electromagnetic waves having a wavelength in the millimetre range are intended to be understood to be electromagnetic waves having a carrier frequency between 61 GHz and 244 GHz. In particular, a wavelength of $\lambda=4.9$ mm results for an electromagnetic wave having the frequency of 61 GHz and a wavelength of $\lambda=1.2$ mm for an electromagnetic wave having a frequency of 244 GHz.

Advantageously, contactless data transmission allows the integration of the transmitting/receiving module(s) in the housing of the corresponding bus participant module. Therefore, no electrical connection (that is to say, no electrical coupling) is necessary for the data transmission between the bus participant modules, and exposed electrical contacts may be dispensed with for data transmission.

The use of electromagnetic waves having a wavelength in the millimetre range further reduces the inductive disturbance during the contactless data supply of bus participant modules.

In particular, the inductive disturbance between the transmitting/receiving modules of the bus participant modules can be reduced by using electromagnetic waves having a wavelength in the millimetre range, which is intended to be explained in greater detail below.

According to the first or second embodiment, a bus participant module is preferably constructed so as to have two transmitting/receiving modules or two transmitting/receiving module groups. Since a simultaneous data transmission is possible, and may be necessary, with the two transmitting/receiving modules, inductive disturbance between two data transmission operations may occur.

Advantageously, the short wavelength of the electromagnetic waves used by the transmitting/receiving modules causes a high level of damping (the so-called free space attenuation) in the air so that inductive disturbance occurs at a wavelength in the millimetre range only at a distance of a few millimetres (between 0 and 20 mm).

Consequently, the transmitting/receiving modules 112, 113 or 212, 213, 214 and 215 of a corresponding bus participant can be arranged extremely close together on a printed circuit board and do not require any particular device for improving the signal-to-noise ratio.

It is unnecessary to mention that the maximum transmitting power of the transmitting/receiving modules 112, 113 or 212, 213, 214 and 215 of the individual bus participant modules is also suitable for use in a modular bus participant system so that the mutual distortion of the contactless data transmission of the bus participant modules is also minimised by means of transmission power adaptation.

Another advantage results from using electromagnetic waves having a wavelength in the millimetre range.

Owing to the short wavelengths, contactless data supply of the bus participant modules is possible with short response times. This advantage is particularly decisive for the application field of automation technology because it is only possible to achieve precise and accurately timed control of industrial operations on the basis of small response times.

According to the first or second embodiment, the bus participant module 110 of the system 100 or the bus participant module 210 of the system 200 comprises a control system 111 or 211. The control system 111 or 211 may be constructed as a microprocessor or as a dedicated logic module and is connected to the transmitting/receiving modules 112, 113 or 212, 213, 214 and 215.

The control system 111 or 211 is configured in such a manner that it provides, on the one hand, the data which are addressed to the bus participant module 110 or 210 and which are transmitted contactlessly thereto for further processing in the bus participant module and, on the other hand, it forwards contactlessly transmitted data which are not addressed thereto to the bus participant module 110 or 210.

Further processing of the contactlessly transmitted data may be carried out by the bus participant module, for example, by means of an external connection of actuators, sensors, initiators and/or other electrical devices of the industry.

In particular, the control system 111 or 211 of a bus participant module 110 or 210 may be constructed in such a manner that the system 110 or 210 functions as a daisy chain. As is generally known, a daisy chain is understood to be a system in which a bus participant module 110 or 210 is connected for data transmission only to its neighbouring, subsequent and preceding bus participant module (relative to a bus participant module which is constructed to control the data transmission as a logical bus master).

Consequently, a data transmission signal has to be forwarded from a data source (the source thereof) under some conditions by one or more bus participant modules before it reaches the provided data sink (the objective thereof).

According to the first and second embodiments, a bus participant module 110 or 210 provides a second transmitting/receiving module 113 or a second transmitting/receiving module group 213, 214, via which subsequent bus participant modules are supplied with a data transmission signal so that a chain of bus participant modules is produced.

Furthermore, the bus participant modules 110 or 210 of the first and second embodiments can be provided with an electrical connection device which is not illustrated, however, in FIGS. 1 and 2 for the sake of clarity. The electrical connection device is constructed in such a manner that it cooperates with an electrical counter-connection device so that a supply of energy to the bus participant module 110 or 210 is possible.

Alternatively, bus participant modules can also comprise a separate electrical energy source (for example, a battery) in order, for example, in the event of a system failure or power failure, to be able to ensure the control of the actuators, sensors, initiators and/or other electrical devices into a predefined rest state. An electrical separation of the corresponding bus participant module (for example, in relation to other bus participant modules) is possible by means of a separate, electrical energy source which is integrated in a bus participant module.

The electrical energy source, in the same manner as the electrical connection device, of a bus participant module is preferably connected inter alia to the transmitting/receiving modules 112, 113 or 212, 213, 214 and 215 and the control system 111, 211 and supplies it with energy.

In conclusion, it may be said that a bus participant module of the first and second embodiments is constructed for mutual or for bilateral data transmission with at least one attached bus participant module by means of the two integrated transmitting/receiving modules or by means of the two groups of transmitting/receiving modules.

Figure 3A:
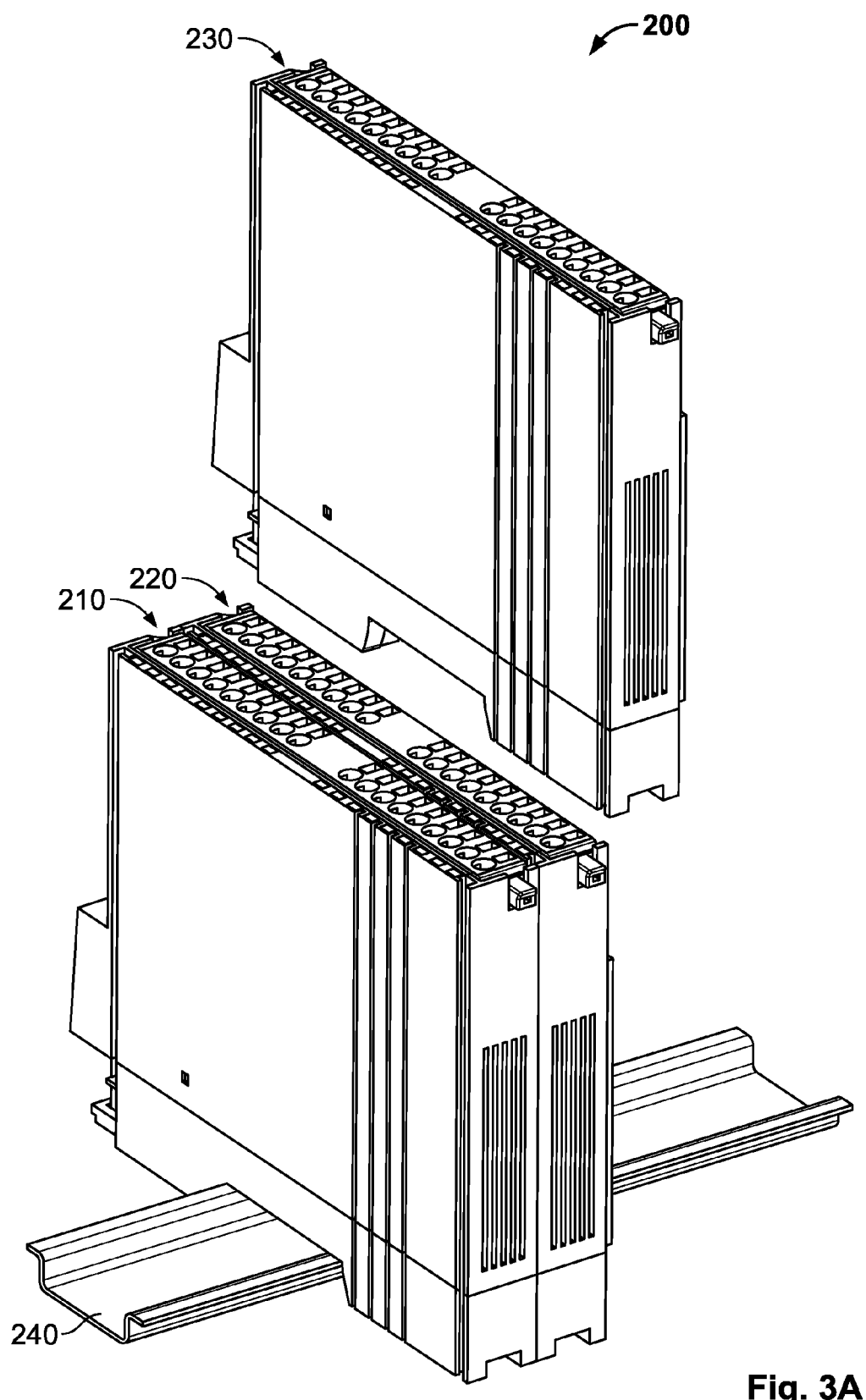
Figure 3B:
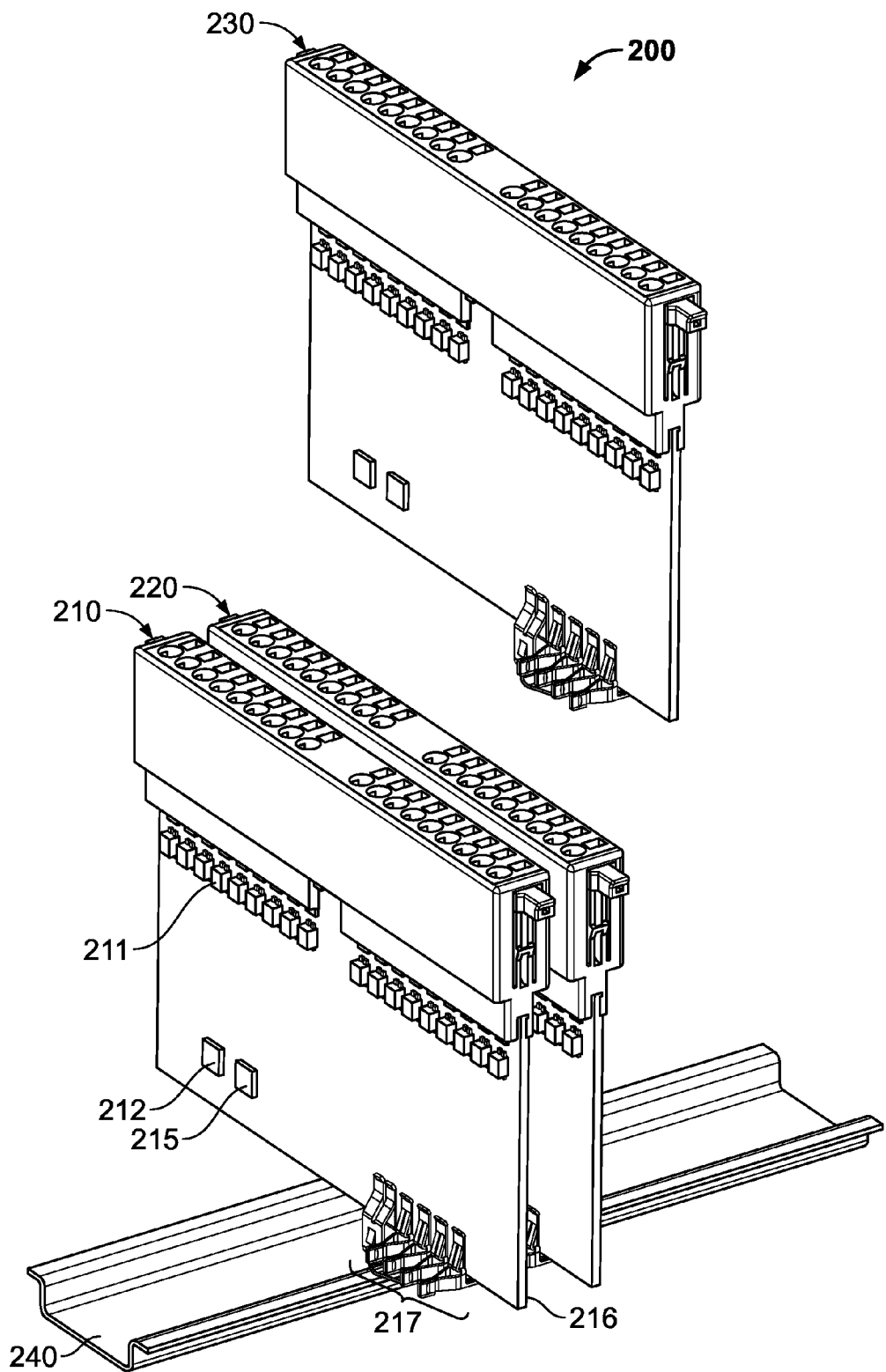

FIGS. 3a and 3b are perspective illustrations of the modular data transmission system of the second embodiment according to the invention. The system 200 shown allows the contactless data supply of bus participant modules. The bus participant modules are illustrated in FIG. 3a with a housing and in FIG. 3b without a housing.

It should be noted that the following explanations with regard to FIGS. 3a and 3b may not only be applied to the modular data transmission system 200 of the second embodiment but may also be used in conjunction with the modular data transmission system 100 of the first embodiment. However, such descriptions were dispensed with simply for reasons of redundancy.

FIGS. 3a and 3b show a modular data transmission system 200 according to the second embodiment which comprises the following elements: a mounting rail 240; a first bus participant module 210 and a second bus participant module 220. As indicated in FIGS. 3a and 3b, the modular data transmission system 200 can also be expanded by a third bus participant module 230, that is to say, in that the third bus participant module 230 is secured to the mounting rail 240 in a state attached to the second bus participant module 220.

The first bus participant module 210 comprises at least one transmitting/receiving module 212, 213, 214 and/or 215; and the second bus participant module 220 also comprises at least one transmitting/receiving module. The transmitting/receiving modules of the first and second bus participant modules 210, 220 are constructed for data transmission by means of electromagnetic waves having a wavelength in the millimetre range.

The bus participant modules 210 and 220 are releasably secured to the mounting rail 240, the mounting rail 240 allowing an arrangement of the bus participant modules 210, 220 in a state able to be attached to each other.

Simply owing to the mechanical securing of the bus participant modules 210 and 220 to the mounting rail in a state attached to each other, there is also determined the lateral orientation of the bus participant modules relative to each other and in particular of the corresponding transmitting/receiving modules of the bus participant modules relative to each other. Consequently, no additional lateral positioning of the transmitting/receiving modules of a bus participant module relative to a corresponding transmitting/receiving module of another bus participant module is necessary.

Generally, the mounting rail 240 provides a mechanical securing device for the bus participant modules 210, 220 and allows the arrangement of the bus participant modules 210, 220 in a main extension direction which corresponds to the extension direction of the mounting rail 240.

Owing to that arrangement, a neighbouring relationship is defined for each bus participant module (for example, bus participant module 210): the bus participant modules which are secured on the mounting rail in a state attached to the corresponding bus participant module are neighbours (that is to say, adjacent bus participant modules) for a bus participant module.

A typical example of a mounting rail 240 is the top hat rail illustrated in FIGS. 3a and 3b, that is to say, a securing rail having a hat-like cross-section. However, it is also possible to use alternative mounting rails 240 having a different cross-section (such as, for example, a G-like, H-like or T-like cross-section) if they allow the bus participant modules 210, 220 to be secured in a state able to be attached to each other.

Such a construction of the mounting rail 240 is associated with the advantage that the bus participant modules 210, 220 can be freely positioned on the mounting rail 240. Restrictions with regard to a predetermined width of the bus participant modules 210, 220 are dispensed with.

The bus participant module 210 further comprises a printed circuit board (PCB), on which the at least one transmitting/receiving module is/are arranged. For example, the bus participant module 210 comprises the printed circuit board 216 on which the transmitting/receiving modules 212, 213, 214 and 215 and the control system 211 are arranged.

Preferably, the transmitting/receiving modules 212, 215 of the first group are arranged at one side of the printed circuit board 216 and the transmitting/receiving modules 213, 214 of the second group are arranged at another side of the printed circuit board 216. In that arrangement of the transmitting/receiving modules, the printed circuit board 216 acts as a shielding device which shields the radiation/receiving of electromagnetic waves of a group of transmitting/receiving modules with respect to the other group of transmitting/receiving modules.

Alternatively, the transmitting/receiving modules can also be arranged at one side of the printed circuit board 216 in the bus participant module, an additional shielding device in the corresponding bus participant module influencing the radiation/receiving of electromagnetic waves to the extent that the radiation/receiving of electromagnetic waves of one group of transmitting/receiving modules is shielded with respect to the respective other group of transmitting/receiving modules.

Furthermore, the bus participant module 210 comprises an electrical connection device 217 which is constructed to supply energy to the bus participant module 210, inter alia the transmitting/receiving modules 212, 213, 214 and 215 and the control system 211. To that end, the electrical connection device 217 is constructed in such a manner that it cooperates with an electrical counter-connection device.

The corresponding electrical counter-connection device can be provided for one or more bus participant modules in a receiving member of the mounting rail, or can be formed by the electrical connection device of another bus participant module secured so as to be attached to the corresponding bus participant module.

In the second embodiment, the electrical connection device 217 of the bus participant module 210 comprises five contact-forming plug connections. Four of those contact-forming plug connections serve to supply electrical power to the bus participant module 210 with one or different potential(s) and the fifth contact-forming plug connection serves to earth the bus participant module 210.

In detail, the contact-forming plug connections of the bus participant module 210 according to the second embodiment are constructed in such a manner that an electrical connection is produced between the printed circuit board 216 located in the bus participant module and the corresponding electrical connection device of the bus participant modules secured in an attached state.

To that end, the contact-forming plug connections of the bus participant module 210 are each constructed at a first end as a clamping contact which engages round the printed circuit board 216 at an edge and which is electrically connected to corresponding printed conductors of the printed circuit board 216 provided at both sides.

The other end (second end) of the four contact-forming plug connections of the bus participant module 210 is provided with two inversely oriented contact regions which allow electrical connection with respect to the bus participant modules which are secured in an attached manner.

An exception is constituted by the fifth contact-forming plug connection of the bus participant module 210. The second end of that fifth contact-forming plug connection which is arranged most centrally in the bus participant module 210 serves to earth the bus participant module 210 via the mounting rail 240.

To that end, the second end of that fifth contact-forming plug connection is not provided with inversely orientated contact regions, like the other four contact-forming plug connections, but instead allows engagement with the mounting rail and therefore produces an electrical connection thereto. In the case of metal mounting rails 216, the bus participant module can be earthed, for example, via such a contact-forming plug connection.

Figure 4A:
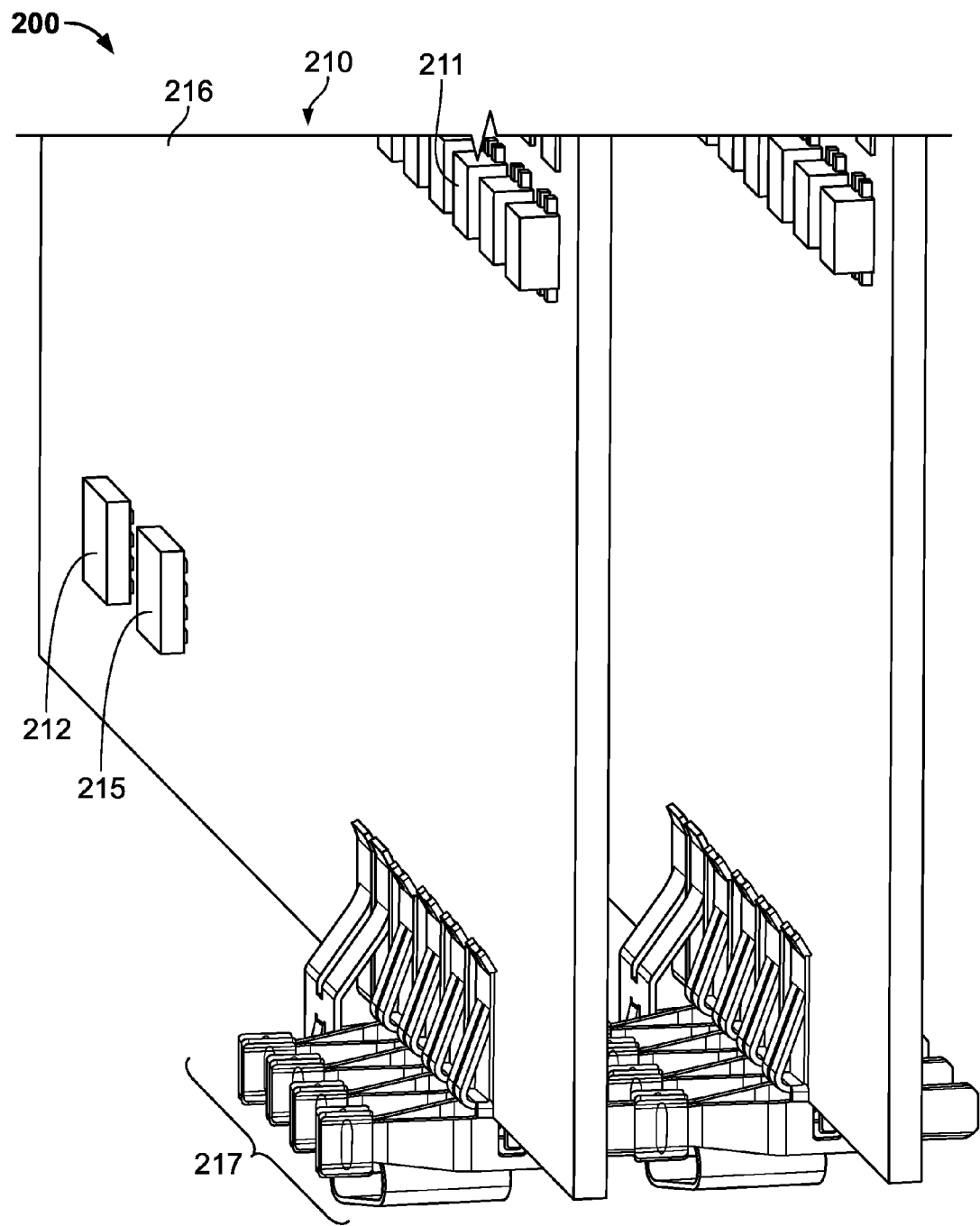
Figure 4B:
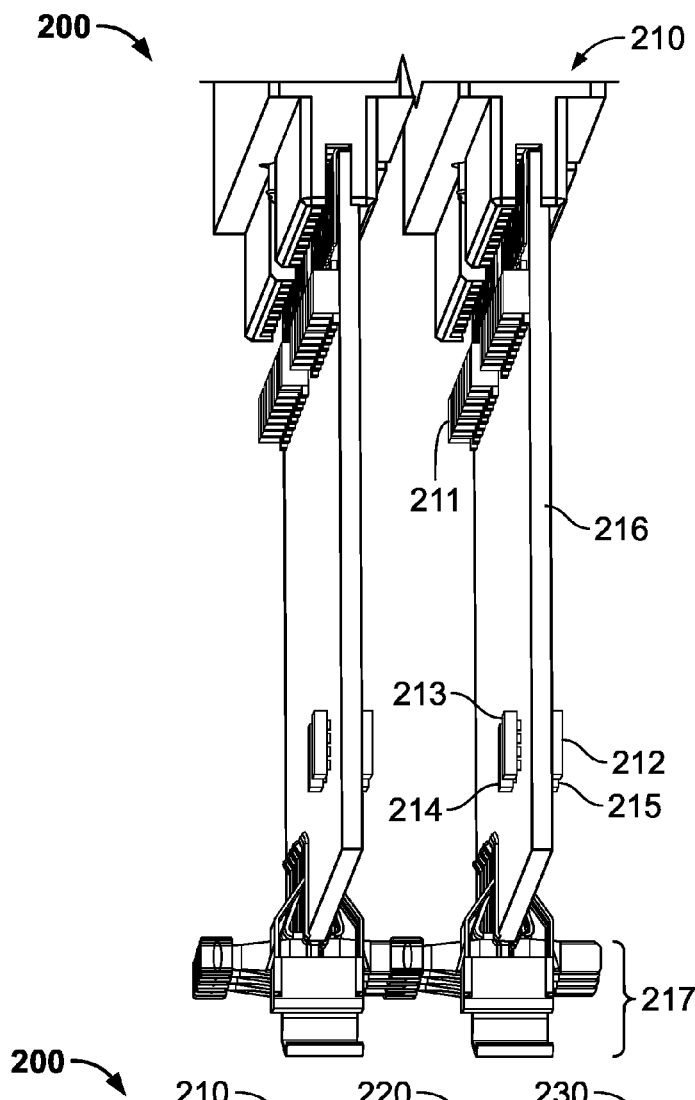

FIG. 4a is a front detailed view and FIG. 4b is a rear detailed view of the perspective illustration of the system 200 from FIG. 3b. Accordingly, FIGS. 4a and 4b relate to the second embodiment of the modular data transmission system.

In particular, FIG. 4b illustrates the bus participant module 210 which comprises the transmitting/receiving modules 212, 215 of the first group in a state arranged at one side of the printed circuit board 216 and the transmitting/receiving modules 213, 214 of the second group in a state arranged at another side of the printed circuit board 216.

Figure 5:
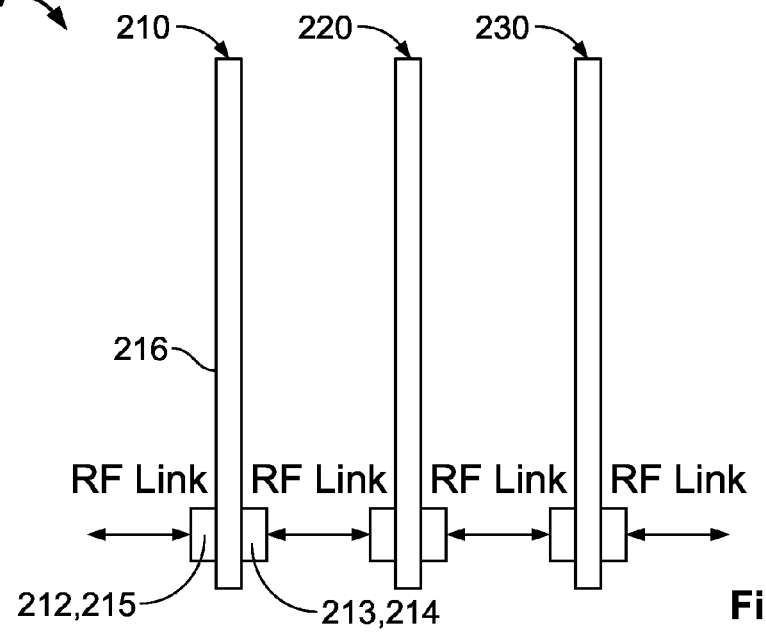
FIG. 5 is a schematic illustration of the data transmission of the system according to the invention for the contactless data supply of bus participant modules of the first or second embodiment.

FIG. 5 is a schematic illustration of the data transmission of the system according to the invention for the contactless data supply of bus participant modules of the second embodiment.

In particular FIG. 5 shows the modular data transmission system 200 which comprises a first bus participant module 210, a second bus participant module 220 and a third bus participant module 230.

Each of the bus participant modules 210, 220 and 230 comprises two groups of transmitting/receiving modules which allow data transmission with the correspondingly adjacent bus participant modules. The two groups of transmitting/receiving modules are arranged at opposing sides of the printed circuit board in a bus participant module.

Figure 6:
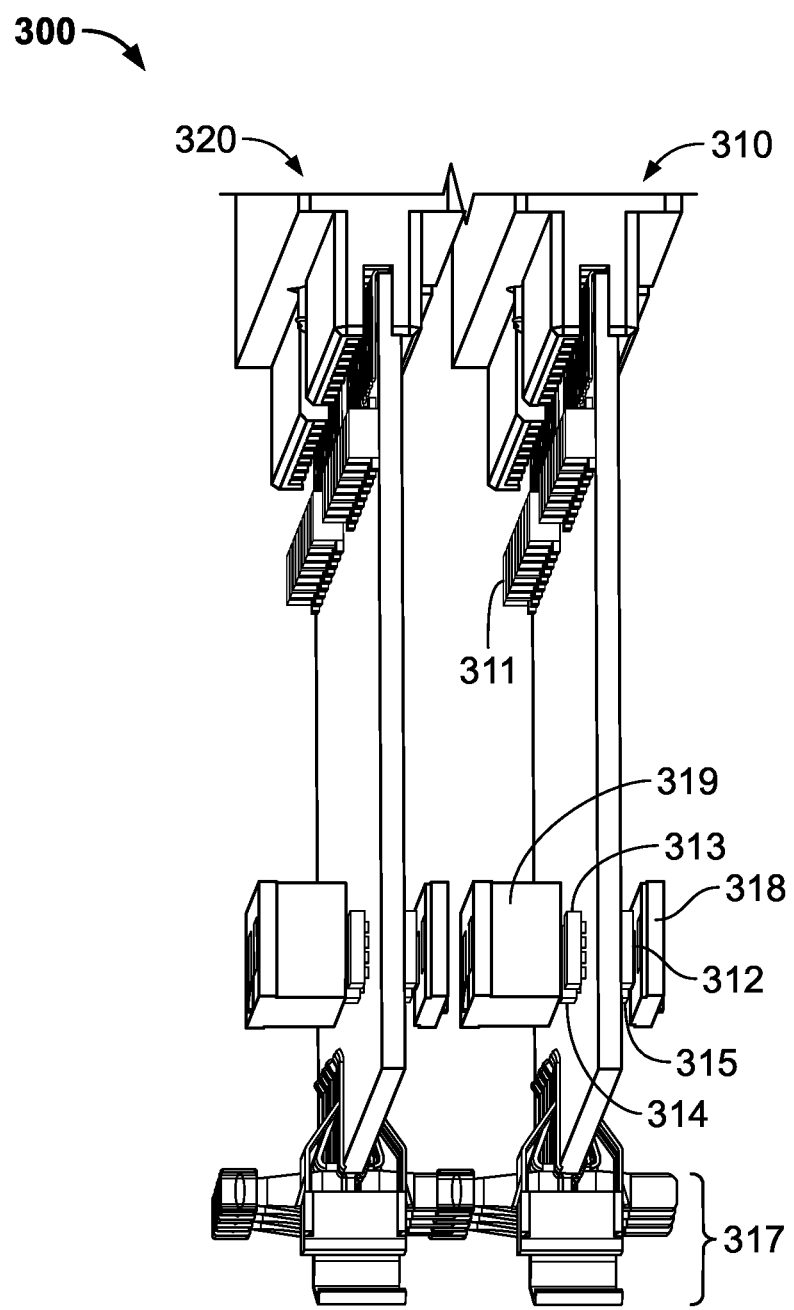
FIG. 6 is a perspective illustration of the system according to the invention for the contactless data supply of bus participant modules without a housing of the individual bus participant modules according to a third embodiment.
Figure 7:
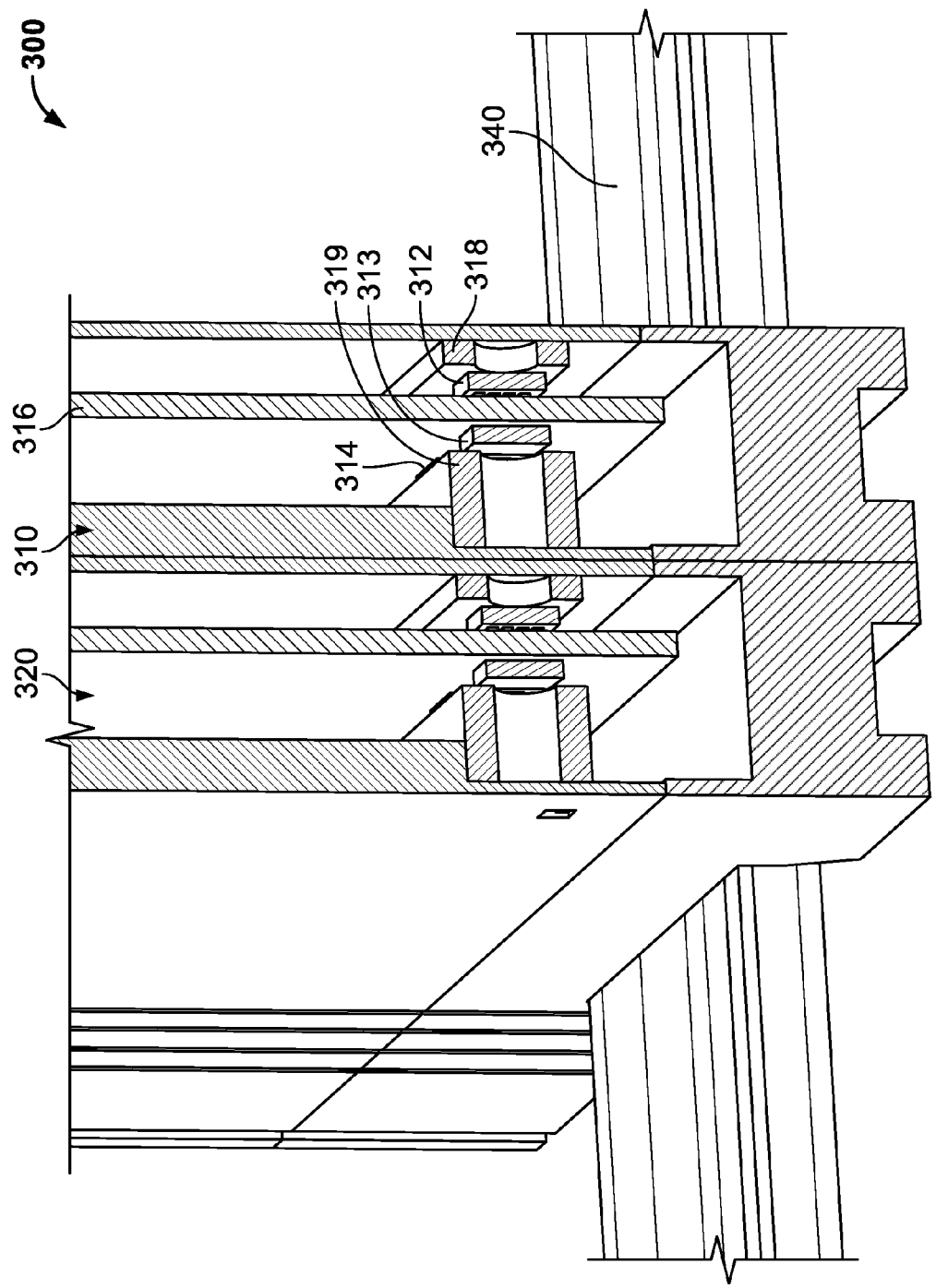
FIG. 7 is a detailed cross-section of the perspective illustration of the system according to the invention from FIG. 6 having a housing of the individual bus participant modules.

A third embodiment of the modular data transmission system 300 according to the invention which is illustrated by way of example in FIGS. 6 and 7 is intended to be described below.

FIG. 6 is a perspective illustration of the system according to the invention for the contactless data supply of bus participant modules. The bus participant modules are illustrated without housings. FIG. 7 is a detailed cross-section of the perspective illustration of the system from FIG. 6 with housings of the individual bus participant modules.

In general, the bus participant modules may be constructed either with two integrated transmitting/receiving modules, as explained in relation to FIG. 1, or with two groups comprising a dedicated transmitting module and a dedicated receiving module, as explained in relation to FIG. 2.

However, the modular bus participant system 300 illustrated comprises a first bus participant module 310 and a second bus participant module 320 which each comprise two groups of transmitting/receiving modules. The bus participant module 310 particularly comprises the two groups of transmitting/receiving modules 312 and 315, 313 and 314. The transmitting/receiving modules 312, 313, 314 and 315 correspond to the transmitting/receiving modules 212, 213, 214 and 215 and a detailed description is intended to be dispensed with in this regard.

It should be set out that the transmitting/receiving modules 312, 313, 314 and 315 are constructed for data transmission by means of electromagnetic waves having a wavelength in the millimetre range.

Advantageously, the wavelength used in the modular bus participant system 300 is between 1 and 5 millimetres so that the transmitting/receiving modules are suitable for transmitting/receiving electromagnetic waves having a carrier frequency between 61 GHz and 244 GHz.

Furthermore, at least the first bus participant module 310 and/or the second bus participant module 320 comprise(s) a waveguide 318. The waveguide is constructed for the low-loss transmission of electromagnetic waves having a wavelength in the millimetre range. Accordingly, the cross-section and the length of the waveguide 318 are adapted to the wavelength.

Furthermore, the waveguide 318 in the first bus participant module 310 and/or the second bus participant module 320 is/are arranged between the transmitting/receiving module of the first bus participant module 310 and the transmitting/receiving module of the second bus participant module 320.

FIGS. 6 and 7 show the bus participant module 310 having two waveguides 318, 319 which are arranged in the housing of the bus participant module 310.

The first waveguide 318 is positioned in relation to the receiving module 312 in such a manner that it guides electromagnetic waves along a path (also a wave propagation path) between the receiving module 312 and a potential transmitting module of a bus participant module which is arranged in a state attached to the bus participant module 310.

The second waveguide 318 is positioned in relation to the transmitting module 313 in such a manner that it guides electromagnetic waves along a path between the receiving module 313 and a receiving module of the bus participant module 320 which is arranged in a state attached to the bus participant module 310.

Owing to a first end of the waveguide being positioned in the region of a transmitting module, the electromagnetic waves emitted by the transmitting module are directed into the waveguide and combined. An electromagnetic wave is then directed within the waveguide as far as a second end of the waveguide.

That second end of the waveguide is advantageously either arranged directly beside a corresponding receiving module or cooperates with a first end of a second waveguide which then has a second end arranged in the region of a corresponding receiving module in order to direct electromagnetic waves to the corresponding receiving module.

Waveguides having different geometries may be used in a bus participant module. For example, waveguides may be straight in a longitudinal direction but also make provision for bends, angles or S-like portions which allows a free arrangement of the transmitting/receiving module in the bus participant module.

In other words:

The first and second embodiments make provision for an opposing arrangement of a transmitting/receiving module of a bus participant module and the corresponding transmitting/receiving module of the bus participant module secured in an attached manner. In this case, electromagnetic waves become propagated along a unidirectional path between a transmitting/receiving module of a bus participant module and the corresponding transmitting/receiving module of the bus participant module secured in an attached manner.

In the third embodiment, however, it is advantageous not to have an opposing arrangement of the transmitting/receiving module of the bus participant module 310 and the corresponding transmitting/receiving module of the bus participant module secured in an attached manner owing to the waveguide 318 in the bus participant module 310.

Instead, the waveguide 318 can influence the propagation direction of the electromagnetic wave in the longitudinal direction of the waveguide in such a manner that electromagnetic waves become propagated along a curved, angled or s-like path. Consequently, the waveguide brings about an ability to freely position the corresponding transmitting/receiving module in the bus participant module.

In addition to the ability involving freedom from positioning, another advantage is associated with the waveguide: electromagnetic waves which are emitted by a transmitting/receiving module of a bus participant are combined by the waveguide and systematically transmitted to a corresponding transmitting/receiving module of an adjacently secured bus participant module.

The waveguide thereby shields other transmitting/receiving modules arranged in close proximity from electromagnetic waves which are emitted by the transmitting/receiving module. Consequently, a waveguide in a bus participant module reduces the signal-to-noise ratio and equally the inductive disturbance with respect to neighbouring bus participant modules. It is also possible to reduce a transmission power of the transmitting/receiving module.

In the third embodiment, the waveguide 319 is arranged in the housing of the bus participant module 310 in such a manner that one end (first end) of the waveguide 319 is directed towards the transmitting/receiving module 313, 314 and the other end (second end) of the waveguide 319 reaches the inner side of the housing of the bus participant module 310. As a result, a radiation of electromagnetic waves by the transmitting/receiving module 312, 315 to the transmitting/receiving modules 313, 314 arranged at the opposite side of the printed circuit board 316 can be reduced.

In particular, the end of the waveguide 319 extending as far as the inner side of the housing of the bus participant module 310 is positioned in such a manner that it is opposite an (other) end (first end) of another waveguide which is arranged in the bus participant module 320 secured to the bus participant module 310 in an attached state. This other waveguide comprises a second end which is positioned in such a manner that electromagnetic waves are conducted by means of the other waveguide from the transmitting/receiving module 313, 314 to the corresponding transmitting/receiving module of the bus participant 320.

It should further be mentioned that each of the waveguides 318 and 319 can also be constructed in such a manner that it provides for two separate paths (also wave propagation paths) for propagating electromagnetic waves. Such a construction of the waveguides is advantageous in connection with groups comprising a dedicated transmitting module and receiving module because it shields both transmission channels which are provided for contactless data transmission from each other between adjacently secured bus participant modules.

Figure 8:
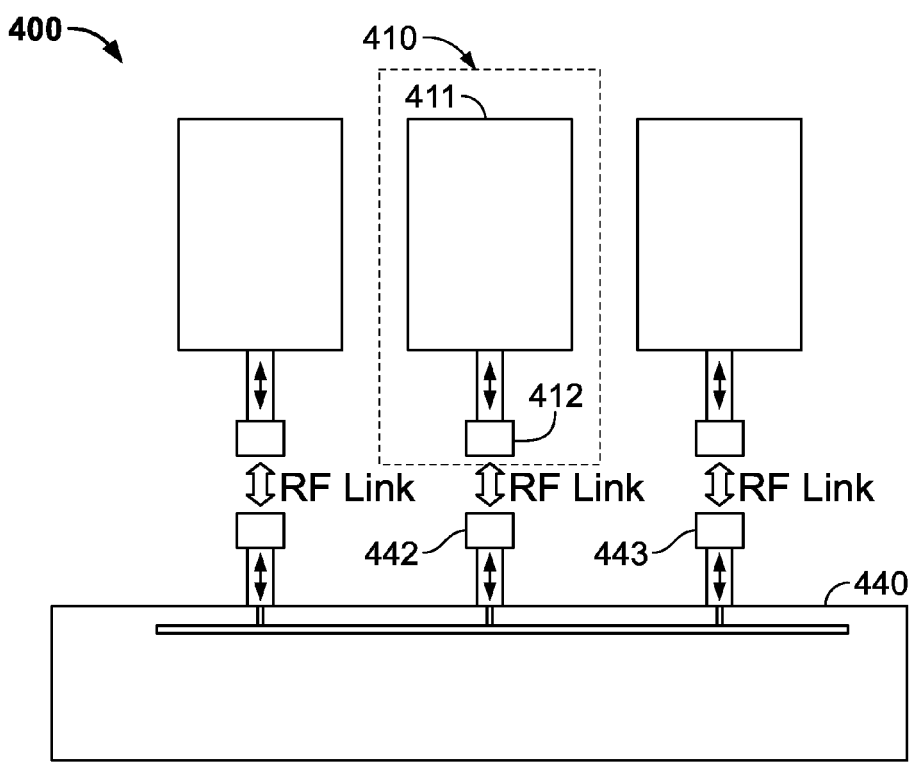
FIG. 8 is a schematic illustration of the data transmission of the system according to the invention for the contactless data supply of bus participant modules according to a fourth embodiment.

A fourth embodiment of a modular data transmission system 400 according to the invention which is illustrated by way of example in FIG. 8 is intended to be described below.

For contactless data transmission, the bus participant module 410 illustrated and the mounting rail 440 each comprise at least one transmitting/receiving module 412 or 442, respectively, whereby data transmission is possible with respect to an adjacently arranged bus participant module of the system.

The modular data transmission system 400 comprises one or more bus participant modules, for example, bus participant modules 410, and a mounting rail 440, which are constructed for contactless data transmission. All the bus participant modules connected in the system are preferably of the same type and, in this case, the following description may be applied equally to such bus participant modules.

In the fourth embodiment, the bus participant module 410 comprises a first transmitting/receiving module 412 and the mounting rail 440 comprises a first and a second transmitting/receiving module 442, 443. Both transmitting/receiving modules 442, 443 of the mounting rail 440 and the transmitting/receiving module 412 of the bus participant module 410 are preferably constructed for two-way data transmission. Simultaneous two-way data transmission with two adjacent bus participant modules is possible by means of the two transmitting/receiving modules 442, 443.

A common aspect of the above-described transmitting/receiving modules 412, 442 and 443 of the corresponding bus participant module 410 or the mounting rail 440 is that they are constructed for data transmission by means of electromagnetic waves having a wavelength in the millimetre range.

Advantageously, the wavelength used in the modular bus participant system 400 is between 1 and 5 millimetres so that the transmitting/receiving modules are suitable for transmitting/receiving electromagnetic waves having a carrier frequency between 61 GHz and 244 GHz.

In connection with this invention, electromagnetic waves having a wavelength in the millimetre range are intended to be understood to be electromagnetic waves having a carrier frequency between 61 GHz and 244 GHz. In particular, a wavelength of $\lambda=4.9$ mm results for an electromagnetic wave having the frequency of 61 GHz and a wavelength of $\lambda=1.2$ mm for an electromagnetic wave having a frequency of 244 GHz.

Contactless data transmission advantageously allows the integration of the transmitting/receiving module(s) in the housing of the corresponding bus participant module/mounting rail. As a result, no electrical connection is necessary for the data transmission between the bus participant modules (that is to say, no electrical coupling) and exposed electrical contacts for data transmission may be dispensed with.

The use of electromagnetic waves having a wavelength in the millimetre range further reduces the inductive disturbance during the contactless data supply of bus participant modules.

Furthermore, the inductive disturbance between the bus participant modules can be reduced by using electromagnetic waves having a wavelength in the millimetre range, which is intended to be explained in greater detail below.

According to the first or fourth embodiment, the mounting rail 440 is preferably constructed so as to have two transmitting/receiving modules 442, 443. Since simultaneous data transmission is possible and may be necessary with the two transmitting/receiving modules, inductive disturbance may occur between two data transmission operations.

Advantageously, the short wavelength of the electromagnetic waves used by the transmitting/receiving modules causes a high level of damping (the so-called free space attenuation) in the air so that inductive disturbance occurs at a wavelength in the millimetre range only at a distance of a few millimetres (between 0 and 20 mm).

Consequently, the transmitting/receiving modules 442, 443 of a mounting rail 440 and therefore also the bus participant modules can be arranged extremely close together on a printed circuit board and do not require any particular device for improving the signal-to-noise ratio.

It is unnecessary to mention that the maximum transmitting power of the transmitting/receiving modules 412, 442 and 443 of the bus participant modules/mounting rail is also suitable for use in a modular bus participant system so that the mutual distortion of the contactless data transmission of the bus participant modules is also minimised by means of a transmission power adaptation.

Another advantage results from using electromagnetic waves having a wavelength in the millimetre range:

Owing to the short wavelengths, contactless data supply of the bus participant modules is possible with short response times. This advantage is particularly decisive for the application field of automation technology because it is only possible to achieve precise and accurately timed control of industrial operations on the basis of small response times.

According to the fourth embodiment, the bus participant module 410 of the system 400 comprises a control system 411. The control system 411 may be constructed as a microprocessor or as a dedicated logic module and is connected to the transmitting/receiving module 412. The mounting rail 440 also comprises a control system (not shown) which is connected to the transmitting/receiving modules 442, 442.

The control system 411 of the bus participant module 410 is configured in such a manner that it provides the data which are addressed to the bus participant module 410 and which are transmitted contactlessly thereto for further processing in the bus participant module. Further processing of the contactlessly transmitted data may be carried out by the bus participant module, for example, by means of an external connection of actuators, sensors, initiators and/or other electrical devices of the industry.

The control system of the mounting rail 440 is configured in such a manner that it forwards the contactlessly transmitted data to the correspondingly addressed bus participant module 410. To that end, the data received by a transmitting/receiving module of the mounting rail are forwarded for transmission by another transmitting/receiving module of the mounting rail.

In particular, the control system of the mounting rail 440 may be constructed in such a manner that the system 400 functions as a data bus. As is generally known, a data bus is understood to be a system constructed in such a manner in which the mounting rail 440 forwards data received by means of contactless data transmission to all other bus participants. Alternatively, however, a control system according to a daisy chain is also possible, wherein data received by a transmitting/receiving module are forwarded only to the corresponding neighbouring transmitting/receiving module(s) of the mounting rail 440 for contactless data transmission.

It follows for a daisy chain that a data transmission signal has to be forwarded from a data source (the source thereof) under some conditions by one or more bus participant modules before it reaches the provided data sink (the objective thereof).

The bus participant module 410 of the fourth embodiment may further be provided with an electrical connection device but it is not illustrated in FIG. 8 for the sake of clarity. The electrical connection device is constructed in such a manner that it cooperates with an electrical counter-connection device in the mounting rail 440 so that a supply of energy to the bus participant module 410 is possible.

Alternatively, bus participant modules can also comprise a separate electrical energy source (for example, a battery) in order, for example, also to be able to ensure the control of the actuators, sensors, initiators and/or other electrical devices into a predefined rest state in the event of a system failure or power failure. An electrical separation of the corresponding bus participant module (for example, in relation to other bus participant modules) is possible by means of a separate, electrical energy source which is integrated in a bus participant module.

The electrical energy source, in the same manner as the electrical connection device, of a bus participant module is connected inter alia to the transmitting/receiving module 412 and the control system 411 and supplies it with energy.

Figure 9:
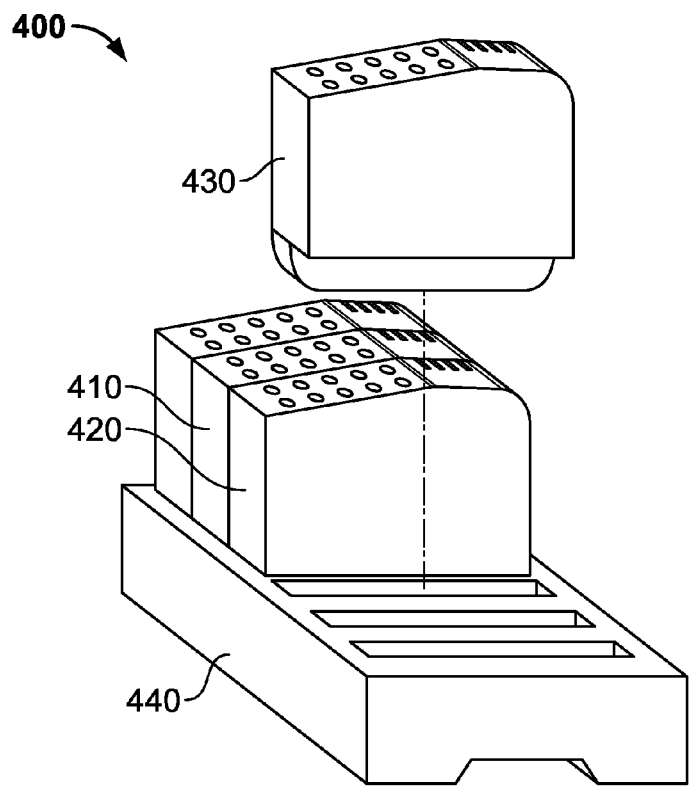
FIG. 9 is a perspective illustration of the system according to the invention for the contactless data supply of bus participant modules of the fourth embodiment.
Figure 10:
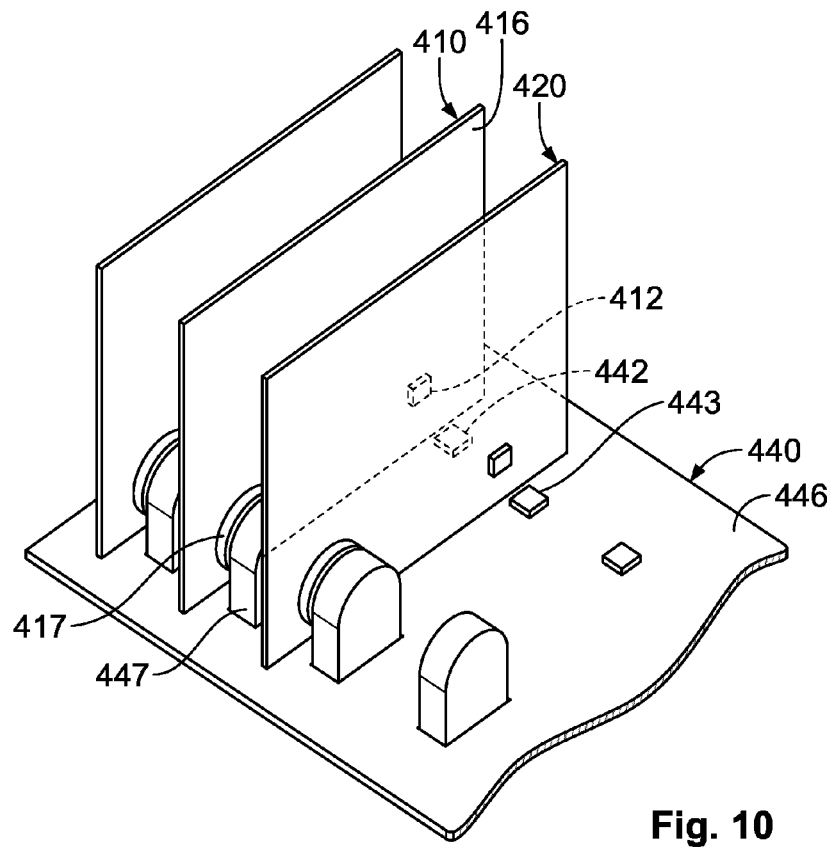
FIG. 10 is a perspective illustration of the system according to the invention for the contactless data supply of bus participant modules from FIG. 9 without a housing of the individual bus participant modules.

FIGS. 9 and 10 are perspective illustrations of the modular data transmission system of the fourth embodiment according to the invention. The system 400 shown allows the contactless data supply of bus participant modules. The bus participant modules and the mounting rail are illustrated in FIG. 9 with a housing and in FIG. 10 without a housing.

FIGS. 9 and 10 show a modular data transmission system 400 according to the fourth embodiment which comprises the following elements by way of example: a mounting rail 440; a first bus participant module 410 and a second bus participant module 420. As indicated in FIG. 9, the modular data transmission system 400 can be expanded by an additional bus participant module 430, that is to say, in that the additional bus participant module 430 is secured to the mounting rail 440 in a state attached to the second bus participant module 420.

However, it should be noted that, for the inventive notion, the modular data transmission system 400 of the fourth embodiment does not necessarily comprise two bus participant modules but instead at least one bus participant module 410.

The first bus participant module 410 comprises one transmitting/receiving module 412 and the mounting rail also comprises at least one transmitting/receiving module 442. The transmitting/receiving modules of the first bus participant module 410 and the mounting rail 440 are constructed for data transmission by means of electromagnetic waves having a wavelength in the millimetre range.

The first bus participant module 410 is releasably secured to the mounting rail 440, the mounting rail 440 allowing an arrangement of additional bus participant modules in a state attached to the first bus participant module 410.

Generally, the mounting rail 440 provides a mechanical securing device for the first bus participant module 410 and optionally additional bus participant module(s) and allows the arrangement of bus participant modules in a main extension direction which corresponds to the extension direction of the mounting rail 440.

Owing to that arrangement, a neighbouring relationship is defined for each bus participant module (for example, bus participant module 410): the bus participant modules which are secured on the mounting rail in a state attached to the corresponding bus participant module are neighbours (that is to say, adjacent bus participant modules) for a bus participant module.

In the fourth embodiment, the mounting rail 440 further provides the wireless data supply of the at least one bus participant module and to that end comprises the at least one transmitting/receiving module 442 explained in the introduction. Accordingly, the mounting rail 440 fulfils the functionality of a "backbone" in the fourth embodiment.

A typical example of a mounting rail 440 is the securing device 440 which is illustrated in FIGS. 9 and 10 and which has a plurality of receiving members arranged in the extension direction of the mounting rail 440. A bus participant module may be arranged such that a receiving member of the mounting rail can be releasably connected thereby to the mounting rail. If the bus participant module is connected to the mounting rail, a connected state will be referred to below.

Such a construction of the mounting rail 440 is associated with the advantage that the at least one bus participant module(s) 410 can be arranged with predetermined receiving members and consequently only at fixed positions of the mounting rail 440 and thereby an address can be assigned to the bus participant module.

Furthermore, the bus participant module 410 comprises a printed circuit board (PCB) 416, on which a transmitting/receiving module 412 is arranged. The mounting rail 440 also comprises a printed circuit board 446 on which at least one transmitting/receiving module 442 is arranged. Furthermore, the control system 411 or 446 can be arranged on the printed circuit board 416, 446 of the bus participant module 410 or the mounting rail 440.

Preferably, the transmitting/receiving module 412 of the bus participant module 410 is arranged at the side of the printed circuit board 416 that is directed towards the position of the corresponding transmitting/receiving module 442 of the mounting rail 442. In this arrangement, the printed circuit board 416 acts as a shielding device which shields the radiation/receiving of electromagnetic waves by the transmitting/receiving module of the bus participant module 410 with respect to the bus participant modules arranged adjacent in each case (in particular arranged so as to be directed away).

In this context, it should be mentioned that, in place of the integrated transmitting/receiving modules 412, 442 and 443 shown, the system 400 may also make provision for groups comprising a dedicated transmitting module and receiving module. Furthermore, a bus participant module of the system 400 may also comprise a waveguide which, in relation to an ability of the transmitting/receiving module to be freely positioned and an improvement of the signal-to-noise ratio, achieves a comparable effect to those waveguides which are described in relation to the third embodiment.

Furthermore, the bus participant module 410 comprises an electrical connection device 417 which is constructed to supply energy to the bus participant module 410, including, among others, the transmitting/receiving module 412 and a control system 411. To that end, the electrical connection device 447 is constructed in such a manner that it cooperates with an electrical counter-connection device.

In the fourth embodiment, the mounting rail 440 comprises at least one electrical counter-connection device 447. The receiving member of the mounting rail 440 may comprise the electrical counter-connection device 447 which, in the connected state, is connected to the electrical connection device 417 of the bus participant module 410 in order to transmit supply energy.

Advantageously, the electrical connection device 417 of the bus participant module 410 may form with the electrical counter-connection device 447 of the mounting rail 440 a contactless connection in order to transmit the supply energy.

Owing to contactless energy transmission, it becomes possible to integrate the transmitting/receiving module together with the electrical connection device in the housing of the corresponding bus participant module. As a result, electrical connections are unnecessary either for the data transmission between the bus participant module and the mounting rail or for the corresponding energy transmission (that is to say, no electrical coupling is required) and exposed electrical contacts for data and energy transmission can be dispensed with.

The same also applies to the mounting rail which consequently also does not require exposed electrical contacts for the contactless data supply and energy supply of bus participant modules.

For a contactless energy transmission, the electrical connection device 417 of the bus participant 410 comprises a part-transmitter having a transmitting/receiving coil and the electrical counter-connection device 447 of the mounting rail 440 comprises a part-transmitter having a transmitting/receiving coil. The part-transmitter of the bus participant module 410 may optionally be integrated in the transmitting/receiving module 412 (not illustrated).

Figure 11:
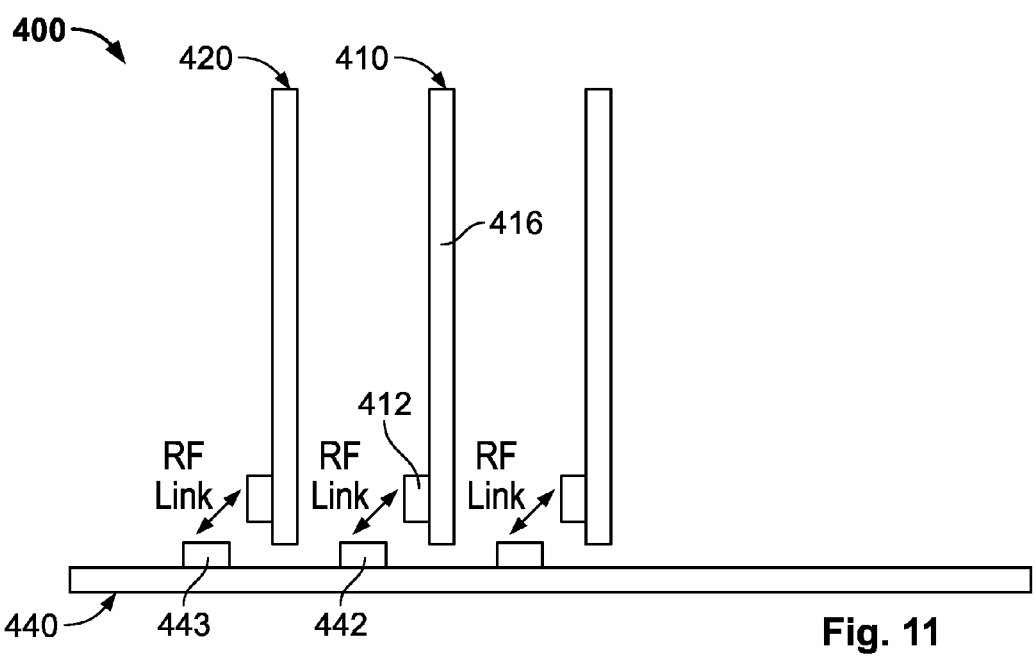
FIG. 11 is a schematic illustration of the data transmission of the system according to the invention for the contactless data supply of bus participant modules of the fourth embodiment.

FIG. 11 is a schematic illustration of the data transmission of the system according to the invention for the contactless data supply of bus participant modules of the fourth embodiment.

In particular, FIG. 11 shows the modular data transmission system 400 which comprises a first bus participant module 410, a second bus participant module 420 and a mounting rail 440.

Each of the bus participant modules 410 and 420 comprises a transmitting/receiving module and the mounting rail 440 also comprises at least one transmitting/receiving module per bus participant module, whereby data transmission is possible with the correspondingly adjacent bus participant modules. The transmitting/receiving module is arranged in the bus participant module at the end of the printed circuit board directed towards the mounting rail.

Figure 12B:
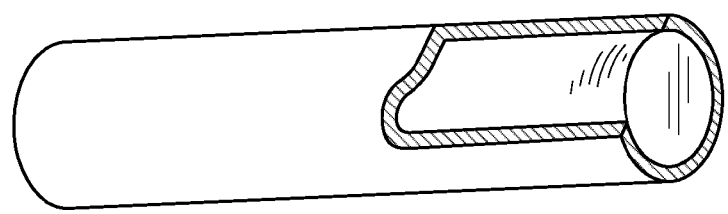
Figure 12C:
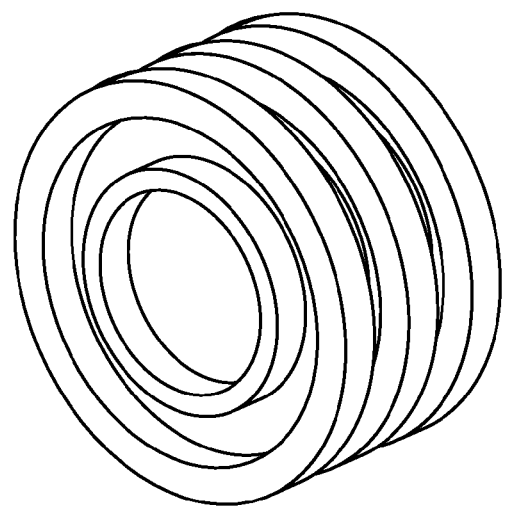

FIGS. 12a to 12c are perspective illustrations of different waveguides for use in the system according to the invention for the contactless data supply of bus participant modules in accordance with one of the preceding embodiments.

In connection with the third and fourth embodiments, it was mentioned that waveguides can be provided in the bus participant modules in order to obtain advantages such as free positionability of the transmitting/receiving module in the bus participant module and an improvement of the signal-to-noise ratio during the wireless data transmission.

A waveguide may be constructed, for example, as a hollow conductor, as illustrated in FIG. 12a.

Alternatively, a waveguide may also be constructed from a structure having a first dielectric material as the core and having one or more metal delimiting elements which surround the core. FIG. 12b shows a waveguide which contains plastics, resin or other dielectric materials as the core and which contains a metal covering surrounding the core as the delimiting element. The metal covering can be constructed as a metal-coated plastics layer or as a metal layer.

In another alternative, the waveguide may be constructed as a structure having a first dielectric material as a core and having a second dielectric material which surrounds the core, the boundary face between the first dielectric material and second dielectric material reflecting electromagnetic waves, cf., for example, FIG. 12c. The decisive aspect is that the two dielectric materials have different refractive indexes for the electromagnetic waves used. This can be achieved, for example, by producing a dielectric band gap.

FIGS. 13a to 13g are perspective illustrations of different waveguides for use in the system according to the invention for contactless data supply of bus participant modules in accordance with one of the preceding embodiments.

Figure 13B:
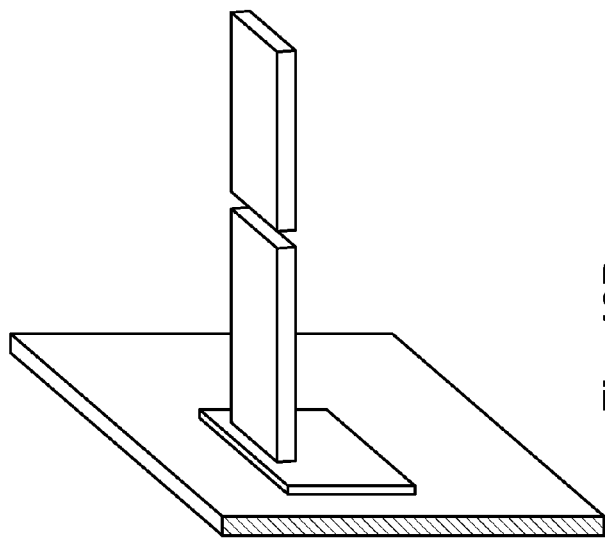
Figure 13D:
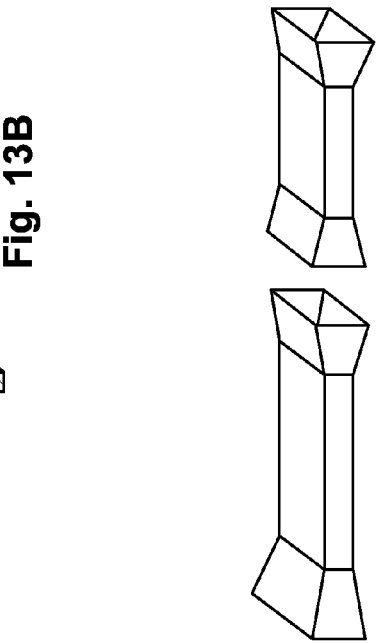
Figure 13A:
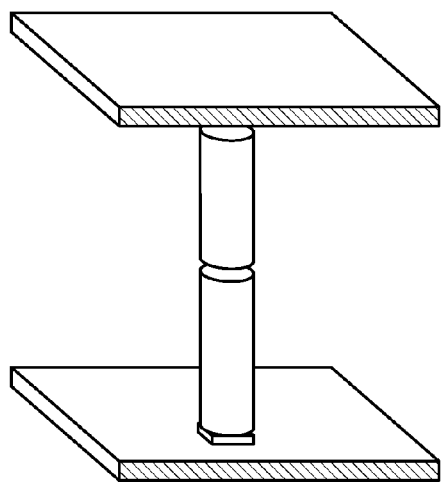

It should particularly be mentioned in connection with FIGS. 13a and 13b that the preceding waveguides from FIGS. 12a to 12c can be formed either with a circular or with an angular cross-section. The diameter or the width of the cross-section of the waveguide is adapted to the wavelength used in the wireless data transmission.

Figure 13C:
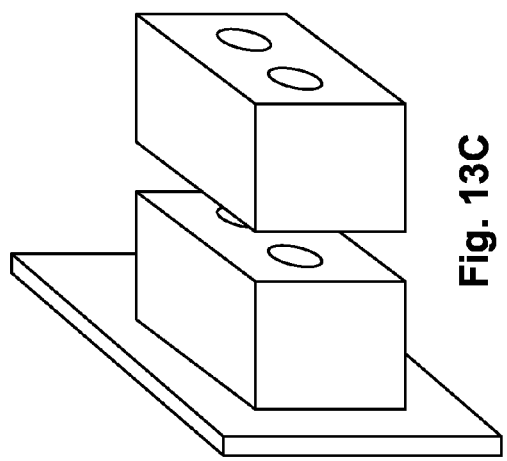

Furthermore, a waveguide, as in FIG. 13c, may also have a plurality of paths (wave propagation paths) for electromagnetic waves of different transmission channels. Two separate wave propagation paths in a waveguide are advantageous in connection with groups comprising a dedicated transmitting module and receiving module. Such a waveguide allows both transmission channels provided for contactless data transmission (transmitting and receiving) to be shielded from each other.

Figure 13F:
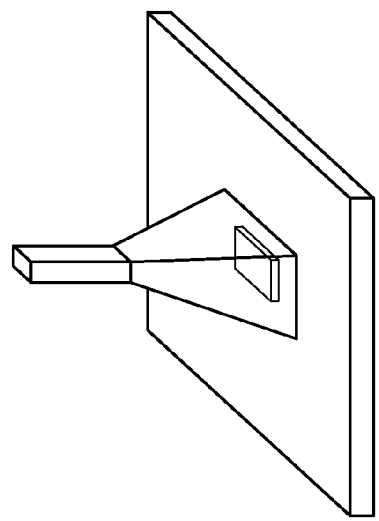
Figure 13G:
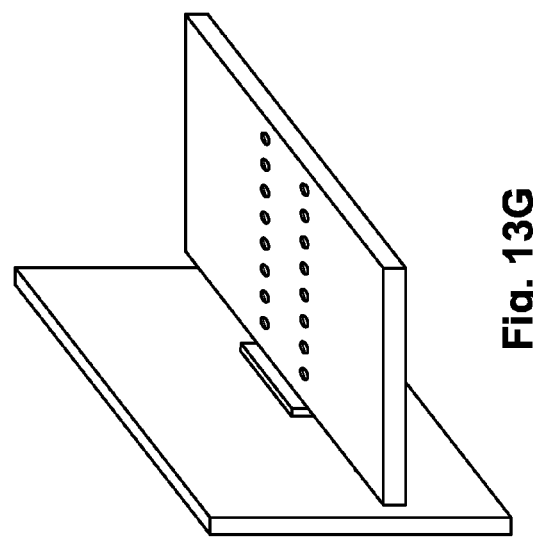

A waveguide may also be provided, as indicated in FIGS. 13d and 13f, with funnel-like end pieces. For example, the second end of the corresponding waveguide extending to the outer side of the bus participant module may be constructed in a funnel-like manner in order to compensate for positioning tolerances when the bus participant modules are secured to the mounting rail. Optionally, the first end of the waveguide may also be constructed in a funnel-like manner.

Figure 13E:
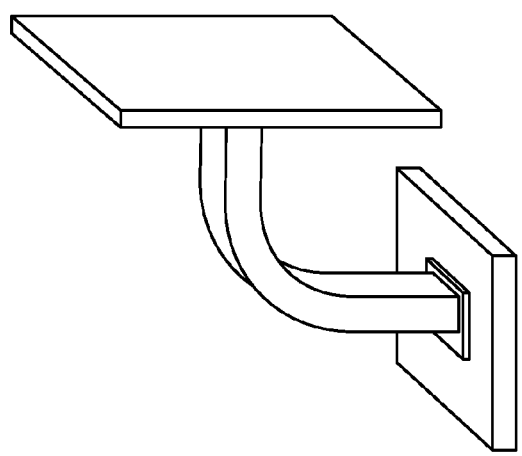

Furthermore, a waveguide may be straight in a longitudinal direction or also make provision for bends, angles or S-like portions. In FIG. 13e, a waveguide is constructed having a bend so that the waveguide guides electromagnetic waves along a path between two transmitting/receiving modules which are arranged at a 90 degree angle to each other. Alternatively, a waveguide, as illustrated in FIG. 13f, may also be constructed in a printed circuit board in which a core is formed from a region of a printed circuit board which is provided without printed conductors and which is surrounded with a plurality of metal holes (through-contacts), the core surrounded by the holes forming a wave propagation path.

| List of reference numerals: | |
| --- | --- |
| Reference numeral | Description |
| 110, 210, 310, 420 | First bus participant module |
| 120, 220, 320, 420 | Second bus participant module |
| 230, 430 | Third bus participant module |
| 340, 440 | Mounting bar |
| 112, 212, 312, 412, 442 | Transmitting/receiving module |
| 113, 213, 313, 443 | Transmitting/receiving module |
| 214, 314 | Transmitting/receiving module |
| 215, 315 | Transmitting/receiving module |
| 216, 316, 416, 446 | Printed circuit board |
| 217, 317, 417 | Electrical connection device |
| 447 | Electrical counter-connection device |
| 318, 319 | Waveguide |

The invention claimed is:

1. A modular data transmission system, comprising:
a mounting rail;
a first bus participant which comprises a first and a second transmitting/receiving module;
a second bus participant which comprises a transmitting/receiving module; and
a third bus participant which comprises a transmitting/receiving module;
the first bus participant and the second bus participant being releasably secured to the mounting rail so as to be arranged adjacently to each other, and the third bus participant being releasably secured to the mounting rail so as to be adjacently arranged to the first bus participant wherein
the transmitting/receiving modules of the first, second, and third bus participants are constructed for data transmission by means of electromagnetic waves having a wavelength in the millimetre range, and
the first bus participant is constructed by means of the first and second transmitting/receiving module for simultaneous data transmission with the transmitting/receiving modules of the adjacently arranged second and third bus participants.

2. Modular data transmission system according to claim 1, with:

at least the first and/or the second bus participant comprising a waveguide which is constructed for the low-loss transmission of the electromagnetic waves and which is arranged between the transmitting/receiving module of the first bus participant and the transmitting/receiving module of the second bus participant.

3. Modular data transmission system according to claim 2, wherein:
at least the first and/or the third bus participant(s) comprising a waveguide which is constructed for the low-loss transmission of the electromagnetic waves and which is arranged between the transmitting/receiving module of the first bus participant and the transmitting/receiving module of the third bus participant.

4. A modular data transmission system according to claim 2, with:
the wavelength being between 1 and 5 millimetres so that the transmitting/receiving modules are suitable for transmitting/receiving electromagnetic waves having a carrier frequency between 61 GHz and 244 GHz.

5. A modular data transmission system according to claim 2, with:
at least one of the bus participants comprising an electrical connection device and the bus participant being arranged in a receiving member of the mounting rail and being releasably connected to the mounting rail thereby; and
the receiving member of the mounting rail comprising an electrical counter-connection device which is connected in the connected state to the electrical connection device of the first bus participant for transmitting supply energy.

6. A modular data transmission system according to claim 5, with:
the electrical connection device of the bus participant forming, with the electrical counter-connection device of the receiving member, a contactless or contact-forming plug type connection for transmitting supply energy.

7. A modular data transmission system according to claim 6, with:
the electrical connection device of the bus participant comprising a part-transmitter having a transmitting/receiving coil and the electrical counter-connection device of the receiving member also comprising a part-transmitter having a transmitting/receiving coil, the part-transmitter of the bus participant optionally being integrated in the transmitting/receiving module of the bus participant.

8. A modular data transmission system according to claim 2, with:
at least one waveguide being arranged in the bus participant in such a manner that the first end of the waveguide is opposite the corresponding transmitting/receiving module of the bus participant and the other end of the waveguide extends to the outer side of the bus participant and this end is opposite a transmitting/receiving module of the adjacent bus participant or a transmitting/receiving module of the mounting rail.

9. Modular data transmission system according to claim 8, with:
the second end of the corresponding waveguide which extends to the outer side of the bus participant being constructed in a funnel-like manner in order to compensate for positioning tolerances when the bus participants are secured to the mounting rail, and optionally the first end of the waveguide also being constructed in a funnel-like manner.

10. A modular data transmission system according to claim 2, with:
at least one waveguide being constructed as a hollow conductor having a circular or angular cross-section.

11. A modular data transmission system, comprising:
a mounting rail which comprises at least a first and a second transmitting/receiving module; and
at least a first bus participant which comprises a transmitting/receiving module and a second bus participant which comprises a transmitting/receiving module;
the first bus participant being releasably secured to the mounting rail, and the second bus participant being releasably secured to the mounting rail so as to be adjacently arranged to the first bus participant, and the mounting rail allowing additional bus participants to be secured in an adjacently attachable manner to the first or to the second bus participant, wherein
the transmitting/receiving modules of the mounting rail and the first and second bus participants are constructed for data transmission by means of electromagnetic waves having a wavelength in the millimetre range, and
the mounting rail is constructed by means of at least the first and second transmitting/receiving module for simultaneous data transmission with the transmitting/receiving modules of the adjacently arranged first and second bus participants.

12. Modular data transmission system according to claim 11, with:
the first bus participant comprising a waveguide which is constructed for the low-loss transmission of the electromagnetic waves and which is arranged between the transmitting/receiving module of the first bus participant and the transmitting/receiving module of the mounting rail.

13. A modular data transmission system according to claim 11, wherein:
at least the first and/or the second bus participant comprising a waveguide which is constructed for the low-loss transmission of the electromagnetic waves and which is arranged between the transmitting/receiving module of the second bus participant and the transmitting/receiving module of the mounting rail.

14. A modular data transmission system according to claim 11, with:
the wavelength being between 1 and 5 millimetres so that the transmitting/receiving modules are suitable for transmitting/receiving electromagnetic waves having a carrier frequency between 61 GHz and 244 GHz.

15. A modular data transmission system according to claim 11, with:
at least one of the bus participants comprising an electrical connection device and the bus participant being arranged in a receiving member of the mounting rail and being releasably connected to the mounting rail thereby; and
the receiving member of the mounting rail comprising an electrical counter-connection device which is connected in the connected state to the electrical connection device of the first bus participant for transmitting supply energy.

16. A modular data transmission system according to claim 15, with:
the electrical connection device of the bus participant forming, with the electrical counter-connection device of the receiving member, a contactless or contact-forming plug type connection for transmitting supply energy.

17. A modular data transmission system according to claim 16, with:
the electrical connection device of the bus participant comprising a part-transmitter having a transmitting/receiving coil and the electrical counter-connection device of the receiving member also comprising a part-transmitter having a transmitting/receiving coil, the part-transmitter of the bus participant optionally being integrated in the transmitting/receiving module of the bus participant.

18. A modular data transmission system according to claim 11, with:
at least one waveguide being arranged in the bus participant in such a manner that the first end of the waveguide is opposite the corresponding transmitting/receiving module of the bus participant and the other end of the waveguide extends to the outer side of the bus participant and this end is opposite a transmitting/receiving module of the adjacent bus participant or a transmitting/receiving module of the mounting rail.

19. A modular data transmission system according to claim 18, with:
the second end of the corresponding waveguide which extends to the outer side of the bus participant being constructed in a funnel-like manner in order to compensate for positioning tolerances when the bus participants are secured to the mounting rail, and optionally the first end of the waveguide also being constructed in a funnel-like manner.

20. A modular data transmission system according to claim 11, with:
at least one waveguide being constructed as a hollow conductor having a circular or angular cross-section.

21. A modular data transmission system according to claim 11, with:
at least one waveguide being constructed as a structure having a dielectric material as a core and having one or more metal delimiting elements which surround the core so that the delimiting element(s) form(s) a wave propagation path having a circular or angular cross-section.

22. A modular data transmission system according to claim 11, with:
at least one waveguide being constructed as a structure having a first dielectric material as a core and having a second dielectric material which surrounds the core, the second dielectric material having a circular or angular cross-section and the boundary face between the first and second dielectric material reflecting the electromagnetic waves.

* * * * *